United States Patent [19]

Luce et al.

[11] 3,936,331

[45] Feb. 3, 1976

[54] PROCESS FOR FORMING SLOPED TOPOGRAPHY CONTACT AREAS BETWEEN POLYCRYSTALLINE SILICON AND SINGLE-CRYSTAL SILICON

[75] Inventors: Robert L. Luce, Los Altos; Arthur J. Bovaird, Santa Clara, both of Calif.

[73] Assignee: Fairchild Camera and Instrument Corporation, Mountain View, Calif.

[22] Filed: Apr. 1, 1974

[21] Appl. No.: 456,499

[52] U.S. Cl. ................. 156/17; 29/571; 29/580; 156/8; 252/79.3; 357/65
[51] Int. Cl.² .................................. H01L 7/50
[58] Field of Search ...... 29/580, 571; 96/36.2, 38.4; 156/3, 8, 11, 17; 252/79.3; 357/22, 53, 59, 60, 65, 68

[56] References Cited
UNITED STATES PATENTS

| | | | |
|---|---|---|---|
| 3,675,319 | 7/1972 | Smith | 156/3 X |
| 3,761,785 | 9/1973 | Pruniaux | 29/580 X |
| 3,768,150 | 10/1973 | Sloan et al. | 29/580 X |

Primary Examiner—William A. Powell
Attorney, Agent, or Firm—Alan H. MacPherson; Henry K. Woodward; J. Ronald Richbourg

[57] ABSTRACT

A structure which achieves a sloped topography where a layer of polycrystalline silicon contacts a single crystal silicon substrate and a process for fabricating the structure are disclosed. The structure comprises a sloped tip of a single crystal silicon material located at the end of the polycrystalline silicon layer and making contact with the single crystal silicon substrate. The process involves defining the polycrystalline silicon layer by applying an orientation-selective etch which etches unwanted polycrystalline silicon preferentially to single crystal silicon so that the sloped tip remains essentially intact to achieve said sloped topography contact area.

5 Claims, 9 Drawing Figures

U.S. Patent  February 3, 1976  3,936,331
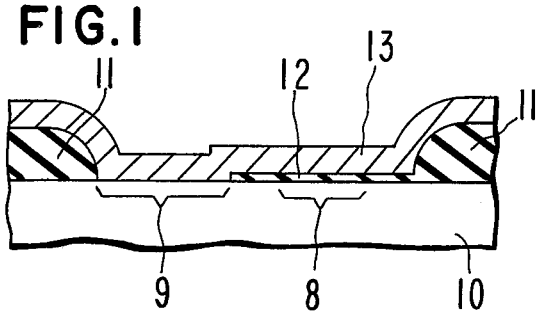
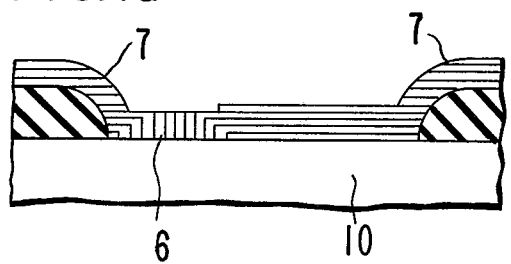
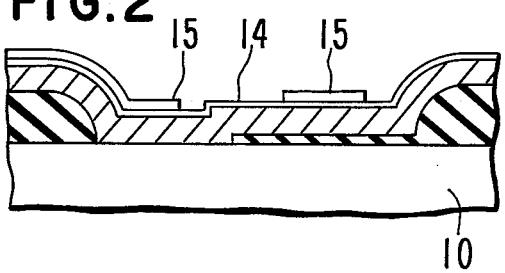
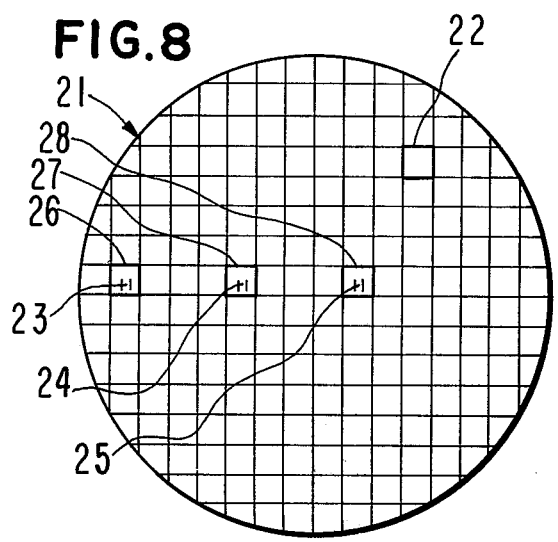
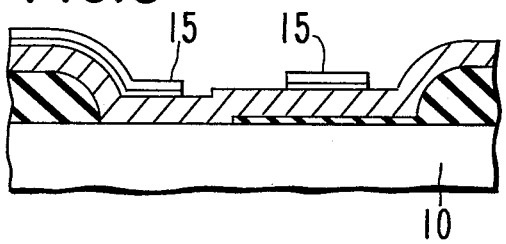
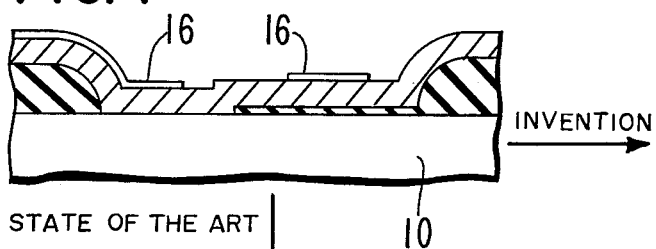
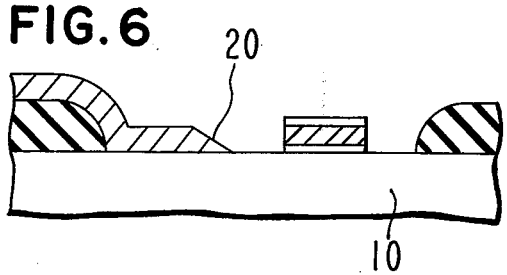
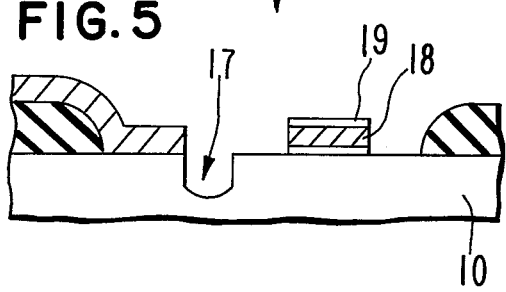
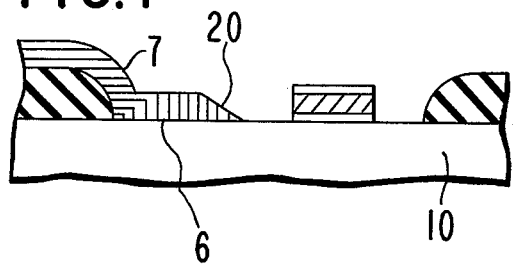

PROCESS FOR FORMING SLOPED TOPOGRAPHY CONTACT AREAS BETWEEN POLYCRYSTALLINE SILICON AND SINGLE-CRYSTAL SILICON

BACKGROUND OF THE INVENTION

This invention relates to a structure and process for forming an electrical contact between polycrystalline silicon and single crystal silicon and, more particularly, relates to a structure and process for forming a sloped topography contact between a layer of polycrystalline silicon and a single crystal silicon substrate.

In the traditional fabrication of semiconductor devices, external electrical contact with active regions within the semiconductor substrate has been made by laying metal lines over the surface of an insulator on the substrate and making physical contact with the active regions through apertures in the insulation. Recently, polycrystalline silicon doped appropriately with p- or n-type impurities has been used in addition to metal to make such electrical contacts. Typically, a polycrystalline silicon layer would be formed over insulation resting on the semiconductor substrate. The conductive polycrystalline silicon would contact the substrate through apertures in the insulation. These contacts are called diffused or buried contacts. Metal lines would then be placed on further layers of insulation placed on the polycrystalline silicon. The added capability of polycrystalline silicon connectors has resulted in new applications and cost savings due to the elimination of process steps, increased yields and denser device geometries made possible by the multi-level connection patterns. However, the use of polycrystalline silicon to make electrical contacts is often accompanied by relatively deep crevices, on the order of 1.5–2.5 $\mu$ deep and 2–10 $\mu$ wide, which result from etching of the single crystal silicon substrate by the etchant used to define the polycrystalline silicon pattern.

The cratered device topography created by the buried contact crevices introduces design inflexibility as subsequent metal lines will either have to avoid these crevices or be subject to random shorting through the intermediate insulation. The irregular contours of the crevices may also adversely affect execution of any subsequent photoresist step, since the photoresist solution will not evenly coat the contours. Thus, it would be highly desirable to obtain sloped topography contact areas which would accept an even coat of photoresist and over which metal lines could be laid without shorting to the underlying polycrystalline silicon.

SUMMARY OF THE INVENTION

Briefly stated, the structure for forming a sloped topography contact area between a layer of polycrystalline silicon and a silicon substrate includes: a single crystal silicon substrate; an insulating layer overlying a portion of the silicon substrate; and a layer of polycrystalline silicon overlying at least a portion of the insulating layer and contacting the substrate through an opening in said insulating layer, the polycrystalline silicon layer including a contiguous tip of single crystal silicon material which contacts the silicon substrate, the tip having a gradually sloped contour with respect to the substrate.

The process of the invention for forming a sloped topography contact area between a polycrystalline silicon layer and a single crystal silicon substrate through openings in the insulation material overlying the substrate includes the steps of: forming a polycrystalline silicon layer over at least a portion of the insulating material and over the single crystal silicon substrate exposed by the openings in the insulation material, the polycrystalline silicon layer including a contiguous tip of single crystal silicon material where the polycrystalline silicon layer contacts the exposed single crystal silicon substrate; and defining the polycrystalline silicon layer by masking those areas of the polycrystalline silicon layer to be retained and etching unmasked polycrystalline silicon areas including the contact area with an orientation selective etch which etches polycrystalline silicon preferentially to single crystal silicon.

BRIEF DESCRIPTION OF THE DRAWINGS

FIG. 1 is a cross-sectional view of a portion of a semiconductor device showing a sloped topography buried contact area and a gate region covered by the polycrystalline silicon deposition;

FIG. 1a is a pictorial view of the cross-section of FIG. 1, illustrating the crystal structure of the deposited polycrystalline silicon;

FIG. 2 is a further view of FIG. 1 in which a layer of silicon dioxide has been grown from the polycrystalline silicon layer and on which a layer of photoresist has been selectively deposited;

FIG. 3 is a further view of FIG. 2 in which those areas of oxide not covered by photoresist have been etched away;

FIG. 4 is a further view of FIG. 3 in which the photoresist has been removed;

FIG. 5 is a further view of FIG. 4 illustrating the state-of-the-art structure obtained after the layer of polycrystalline silicon and the gate oxide have been defined;

FIG. 6 is a still further view of FIG. 4 illustrating the structure obtained by the process of the present invention after the layer of polycrystalline silicon and the gate oxide have been defined;

FIG. 7 is a pictorial view of the cross-section of FIG. 6 illustrating the crystal structure of the sloped topography contact area between the polycrystalline silicon layer and the silicon substrate; and FIG. 8 is a plan view of die locations in a standard wafer.

DESCRIPTION OF THE PREFERRED EMBODIMENTS

The use of polycrystalline silicon conductors in addition to metal in the fabrication of semiconductor devices is a beneficial development because the double interconnection layer allows a denser layout of active components. Polycrystalline silicon also allows formation of the source/drain regions by using the polycrystalline silicon as a diffusion mask, thereby eliminating the possibility of overlapping mask alignments which can produce additional device capacitance and associated reduction in frequency response. Since polycrystalline silicon utilizes the same types of techniques as are used in processing the silicon substrate and insulating layers, there is an inherent advantage in both the capital costs of process equipment and the number of process steps required to produce a particular device. One particular area-saving advantage is that direct electrical contact may be made by forming diffused or buried contacts between the polycrystalline silicon and the silicon substrate. This advantage, however, is counterbalanced by the fact that single crystal silicon may be affected by some of the process steps used to lay out and define the polycrystalline silicon. In particular, the single crystal silicon substrate may be etched by the etchant used to define the polycrystalline silicon. For practical applications, then, it is necessary to establish process steps for the polycrystalline silicon which do not affect single crystal silicon. Shielding, if used, would introduce additional process steps, which would be self-defeating. Thus, the process provided by the present invention which differentially etches the two types of silicon is highly desirable and useful.

The process steps which produce the structure of the present invention are set out in the FIGS. FIG. 1 illustrates an intermediate stage of wafer processing in which field oxide 11 has been opened up in order to allow electrical contact with the semiconductor substrate 10. Gate oxide 12 has been grown on a portion of the open area which will become the effective insulating layer between a polycrystalline silicon gate located at interval 8 and the semiconductor substrate 10. A layer of polycrystalline silicon 13 of uniform thickness has been deposited over the field oxide 11, gate oxide 12 and the open interval 9 to the substrate 10 at which the buried contact will be made.

The crystal structure of the polycrystalline silicon layer 13 is shown in FIG. 1a. It is polycrystalline silicon wherever the deposited material overlies silicon dioxide (as shown by horizontal shading 7) and predominently single-crystal silicon (as shown by vertical shading 6) wherever the deposited material overlies the single crystal silicon substrate 10. This structure results from the growth of single crystal silicon on the seed crystal structure available where the single crystal substrate is exposed. Where the atomic silicon, typically obtained from a silane and hydrogen or nitrogen reaction, encounters the amorphous silicon dioxide surface, the amorphous crystal character of polycrystalline silicon is obtained. The influence of the single crystal substrate 10 is reduced as the deposited layer becomes thicker so that the single crystal growth tends to be triangular in shape.

A layer of protective oxide 14 is grown from the polycrystalline silicon layer 13 by oxidation as shown in FIG. 2. Next, a photoresist pattern 15 is formed on the protective oxide layer 14 by standard masking means. Then the areas of the protective oxide layer 14 which are not covered by the photoresist layer 15 are removed by etching, for example, with a buffered hydroflouric acid solution, with the result shown in FIG. 3. The removal of selected portions of the protective oxide layer 14 defines those areas of the polycrystalline silicon which are ultimately to be removed. Finally, the photoresist pattern is removed, for example, by dissolving in a strong inorganic acid bath, and the defined protective oxide pattern 16 remains as shown in FIG. 4.

The state-of-the-art method for removing the unwanted polycrystalline silicon as defined by protective oxide pattern 16 is to etch it with an etchant which etches polycrystalline silicon and single crystal silicon but does not etch the protective oxide pattern 16 or at least etches it at such a slow rate that negligible amounts of the oxide are removed. A typical etch is 4% HF and 96% nitric acid. Such an etch takes about 20 seconds to define the polycrystalline silicon on a 3-inch wafer. The structure which results after the state-of-the-art step is shown in FIG. 5. The groove 17 is formed in the state-of-the-art step because most conventional etches will etch standard single crystal silicon at a rate equivalent to that for polycrystalline silicon. Nonuniformities in the thickness of the polycrystalline silicon layer cause the thinner portions to be etched for periods longer than necessary to remove polycrystalline silicon so that some portions of the single crystal silicon substrate are exposed before all unwanted polycrystalline silicon is removed. The problem of exposure of the single crystal silicon substrate is compounded by the "center die" phenomenon which causes each die on a wafer to experience a different etch rate. This differential etch rate is particularly aggravated on large three-inch wafers. Such a large wafer 21 is shown in FIG. 8 to contain many hundreds of individual dice 22. The differential etch rate occurs because one component of the etchant diffuses through a liquid to the surface of the wafer and the larger solid angle around the periphery of the wafer allows more active etching. Also, wafers are often lined up in rows for processing, thereby further restricting access of the etchant to the central regions of the wafer. Consequently, it is difficult to maintain dimensional control for any given physical item such as corresponding lines 23, 24 and 25 of die 26, 27 and 28, respectively. Due to the differential etch rate, die 26 will have a higher etch rate than die 27, which in turn will have a higher etch rate than die 28. Since the ultimate goal of semiconductor fabrication is to obtain optimum overall yield, it is necessary to maintain the etch as long as necessary to etch all die in the central region. Thus, die on the periphery will be exposed to the etch much longer than absolutely necessary. For these reasons, deep grooves such as groove 17 in FIG. 5 will be formed in some dice where the etch encounters single crystal silicon after it has etched off the unwanted polycrystalline silicon. Some of the polycrystalline silicon and gate oxide is also etched away but not enough to affect the operation of the final device. The process of the present invention is to use an orientation-selective etch to define the polycrystalline silicon so that polycrystalline silicon is etched preferentially to single crystal silicon. As recited above, the polycrystalline silicon layer has been deposited in a manner well known to those skilled in the semiconductor fabrication art to achieve a contiguous tip of single crystal silicon where the silicon substrate has been exposed. Thus, when the contiguous single crystal tip is reached by the etchant before all unwanted polycrystalline silicon is removed, the tip will remain essentially intact and no crevices in the single crystal silicon substrate will be formed. An added benefit is that the orientation-selective etch is slower and allows the operator a greater margin for controlling the definition operation.

The process of the present invention is carried out between the stages shown in FIGS. 4 and 6. An orientation-selective etch which etches polycrystalline silicon at a much faster rate than it etches standard single crystal silicon is used. Thus, the unprotected polycrystalline silicon is completely etched away while little etching of the tip 6 of single crystal material shown in FIG. 1a occurs. Known etches will etch single crystal silicon with a (1, 0, 0) orientation much faster than (1, 1, 1) single crystal silicon. These etches have also been found to etch polycrystalline silicon at a much faster rate than single crystal silicon and particularly standard (1, 0, 0) and (1, 1, 1) single crystal silicon. These etches include heated KOH, hydrazine and ammonium flouride-nitric acid. Ammonium flouride-nitric acid is preferred because there is less contamination of the substrate and because the preferential etch rate is greater than five to one.

What is claimed is:

1. A process for forming a sloped topography buried contact area between a polycrystalline silicon conductive layer and a single crystal silicon substrate through openings in insulation material overlying said substrate without creation of deep crevices in said contact area, comprising:

forming a polycrystalline silicon layer over at least a portion of said insulating material and over the single crystal silicon substrate exposed by said openings in said insulation material, said polycrystalline silicon layer including a contiguous tip of single crystal silicon material where said polycrystalline silicon layer contacts said exposed single crystal silicon substrate; and defining said polycrystalline layer by masking those areas of said polycrystalline silicon layer to be retained and etching unwanted polycrystalline silicon areas including said contact area with an orientation selective etch which etches polycrystalline silicon preferentially to single crystal silicon whereby unwanted polycrystalline silicon is removed while said contiguous tip of single crystal silicon material inhibits creation of deep crevices in said contact area.

2. A process for forming a sloped topography contact area in accordance with claim 1 wherein said silicon substrate has a (1, 0, 0) crystal orientation.

3. A process for forming a sloped topography contact area in accordance with claim 1 wherein said silicon substrate has a (1, 1, 1) crystal orientation.

4. A process for forming a sloped topography contact area in accordance with claim 3 wherein said orientation selective etch preferentially etches said polycrystalline silicon over said (1, 1, 1) orientation single crystal silicon by a factor of greater than five to one.

5. A process for forming a sloped topography contact area in accordance with claim 4 wherein said orientation selective etch is ammonium flouride-nitric acid.

* * * * *